(12) United States Patent
Park

(10) Patent No.: US 6,319,803 B1
(45) Date of Patent: *Nov. 20, 2001

(54) METHOD OF FABRICATING SEMICONDUCTOR DEVICE

(75) Inventor: Seong-Hyung Park, Seoul (KR)

(73) Assignee: Hyundai Electronics Industries Co., Ltd., Kyoungki-Do (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/373,001

(22) Filed: Aug. 12, 1999

(30) Foreign Application Priority Data

Jan. 22, 1999 (KR) ..................................... 99-1910

(51) Int. Cl.[7] ................................................ H01L 21/44
(52) U.S. Cl. ........................... 438/586; 438/199; 438/218
(58) Field of Search ................................... 438/157, 159, 438/116, 199, 283, 586, 587, 598, 200, 201, 211, 218, 219, 227, 231

(56) References Cited

U.S. PATENT DOCUMENTS

| | | | | |
|---|---|---|---|---|
| 4,178,605 | * | 12/1979 | Hsu et al. | 257/373 |
| 5,017,507 | * | 5/1991 | Miyazawa | 438/227 |
| 5,219,784 | * | 6/1993 | Solheim | 438/586 |
| 5,223,456 | * | 6/1993 | Malwah | 438/586 |
| 5,956,566 | * | 9/1999 | Lin et al. | 438/17 |
| 6,008,081 | * | 12/1999 | Wu | 438/210 |
| 6,117,754 | * | 9/2000 | Wu | 438/586 |

* cited by examiner

Primary Examiner—John F. Niebling
Assistant Examiner—Christopher Lattin
(74) Attorney, Agent, or Firm—Morgan, Lewis & Bockius LLP

(57) ABSTRACT

A method of fabricating a semiconductor device is disclosed in the present invention. The method includes the steps of forming first and second wells in the substrate, the first and second wells having first and second type conductivities, respectively, forming first, second, and third isolation layers in the substrate, forming first and second gate oxide layers on the first and second wells, forming first and second buried contact regions in the substrate, and forming first and second impurity regions in the first and second buried contact regions, and forming first and second gates on the first well and third and fourth gates on the second well, the first and fourth gates directly contacting the first and second buried contact regions, respectively.

20 Claims, 4 Drawing Sheets

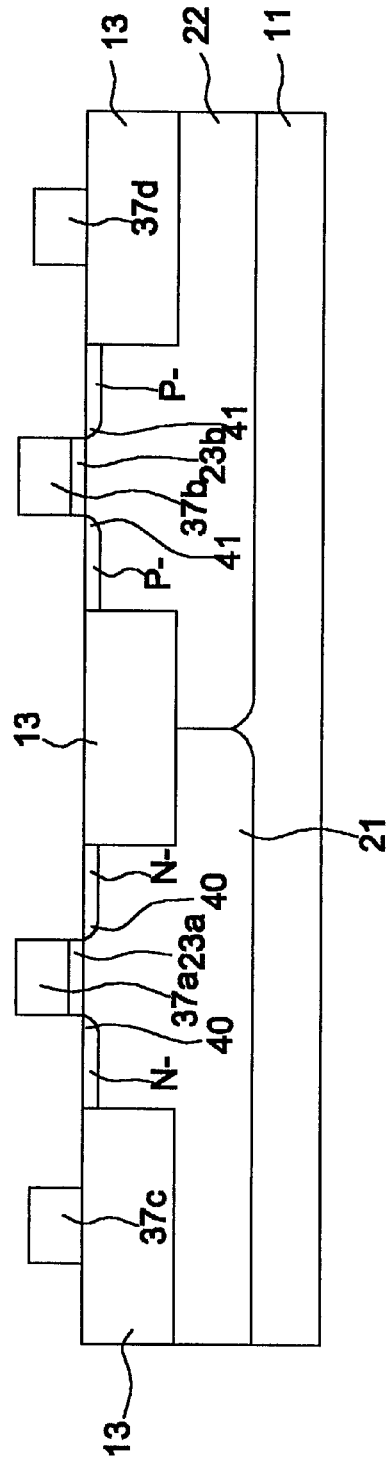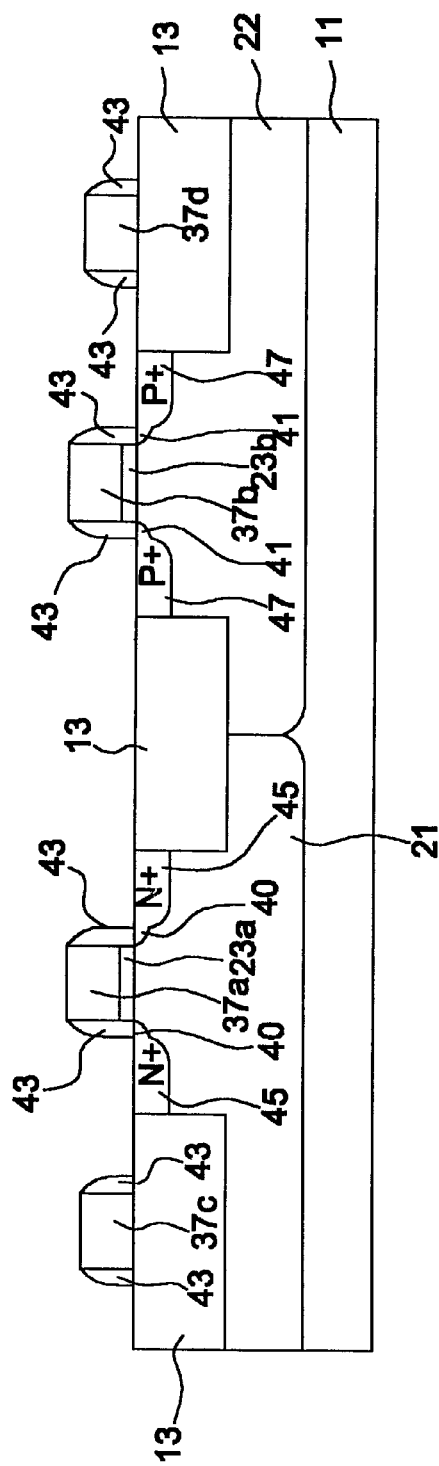

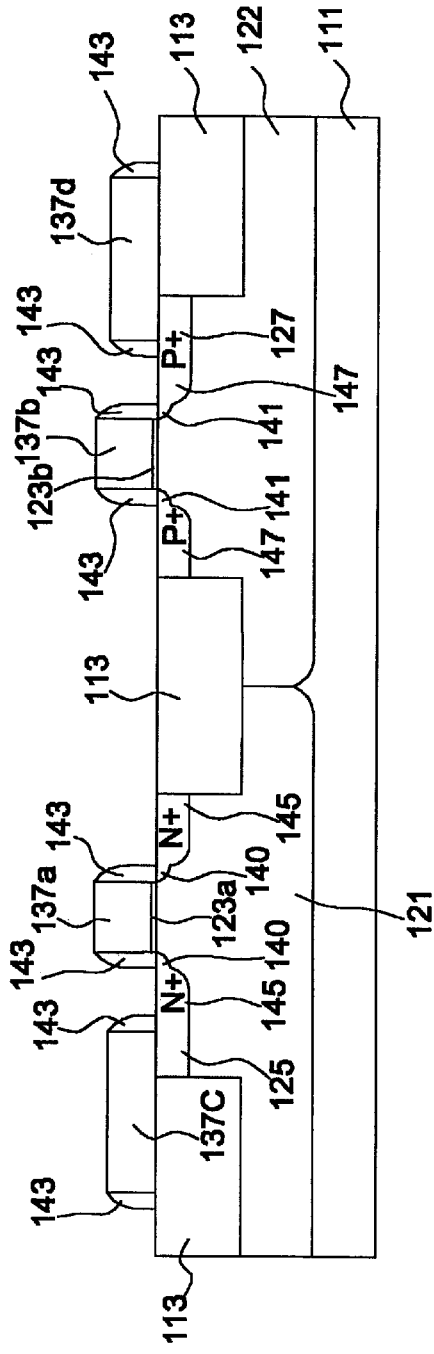
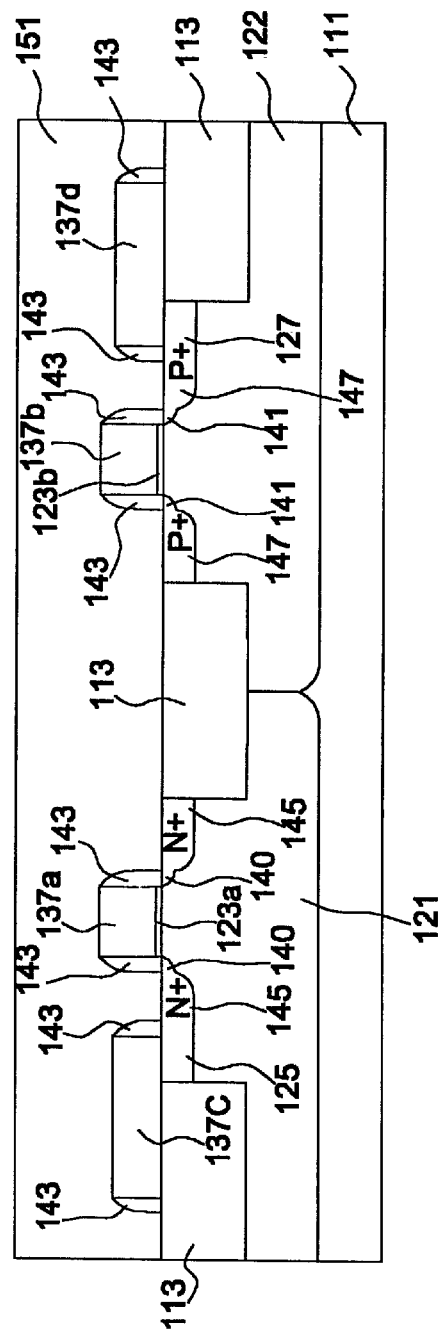

METHOD OF FABRICATING SEMICONDUCTOR DEVICE

This application claims the benefit of Korean Application No. 1910/1999 filed Jan. 22, 1999, which is hereby incorporated by reference.

BACKGROUND OF THE INVENTION

1. Field of the Invention

The present invention relates to a semiconductor device, and more particularly, to a method of fabricating a semiconductor device. Although the present invention is suitable for a wide scope of applications, it is particularly suitable for fabricating a semiconductor device having a local interconnection (LI) between a gate and a junction.

2. Discussion of the Related Art

FIGS. 1A to 1C are cross-sectional views illustrating the process steps of fabricating a semiconductor device according to a related background art.

Initially referring to FIG. 1A, a P well 21 and an N well 22 which have a predetermined depth are formed in a semiconductor substrate 11. A thin silicon oxide ($SiO_2$) layer is formed on the exposed surface of the semiconductor substrate 11 which has an isolation layer 13 selectively formed to define an active region. A thick polysilicon layer is then deposited on the thin silicon oxide layer as well as on the isolation layer 13. Using a photolithographic process, a photoresist film (not shown) is formed on the polysilicon layer formed at a gate region. In this process, the photoresist film acts as a mask, and a portion of the polysilicon layer is removed by a plasma etching method. Thus, first, second, third, and fourth gates 37a, 37b, 37c, and 37d are formed on the semiconductor substrate 11, and only portions 23a and 23b of the silicon oxide layer remain below the first and second gates 37a and 37b. After the first to fourth gates 37a to 37d are formed, the photoresist film is removed from each gate.

Thereafter, using photolithography, the N well region 22 is covered with a photoresist film (not shown) while the P well region 21 is exposed. The first gate 37a is used as a mask, so that a self-alignment process is used in executing an ion implantation to form a lightly doped drain (LDD) region in the semiconductor substrate of the P well region 21. Thus, a lightly doped N-type region 40 is formed at both sides of the first gate 37a in the semiconductor substrate.

Similarly, after removing the photoresist film, only the N well region 22 is exposed by photolithographic process. The second gate 37b is then used as a mask to form a lightly doped P-type region 41 of the N well region 22 by an ion implantation. Thus, the lightly doped P-type region 41 is formed at both sides of the second gate 37b in the semiconductor substrate by a self-alignment process.

The isolation layer 13 is formed of a silicon oxide ($SiO_2$) layer formed by a shallow trench isolation (STI) method. The above-mentioned thin silicon oxide film is grown on the semiconductor substrate 11 by thermal oxidation. The first, second, third, and fourth gates 37a, 37b, 37c, and 37d are polysilicon layers having a thickness of in the range of 2500 to 4000 Å. Also, the polysilicon layers have a fine grain structure and are deposited by chemical vapor deposition (CVD).

The first and second gates 37a and 37b protect the respective the silicon oxide ($SiO_2$) layers 23a and 23b from a channeling effect during the subsequent ion implantation. The photoresist film is removed using a solvent or oxygen plasma.

In the process of forming the lightly doped N-type region 40, ion implantation is performed with phosphorus (P) ions of $1.0 \times 10^{13}$ to $1.0 \times 10^{14}$ atoms/cm$^2$ using an acceleration energy of 40 KeV. Simultaneously, the first and third gates 37a and 37c are also lightly doped by ion implantation. In forming the lightly doped P-type region 41, (using $BF_2$ as a boron source) ion implantation is performed with boron ions of $1.0 \times 10^{13}$ to $1.0 \times 10^{14}$ atoms/cm$^2$ using an acceleration energy of 50 KeV. Similarly, the second and fourth gates 37b and 37d are lightly doped by ion implantation.

Referring to FIG. 1B, a silicon oxide ($SiO_2$) layer is deposited on the entire surface of the semiconductor substrate 11 by CVD. Then, silicon oxide layer is etched by anisotropic plasma etching to form a plurality of spacers 43 on sides of the gates 37a, 37b, 37c, and 37d.

Subsequently, a photolithography is performed to cover the N well region 22 with a photoresist film (not shown) and to expose the P well region 21. The first gate 37a is used as a mask in performing an N-type ion implantation in the semiconductor substrate of the P well region 21. Thus, a self-alignment process is used in forming a heavily doped N-type region 45. Similarly, a heavily doped P-type region 47 is formed by using the second gate 37b as a mask for performing a P-type ion implantation. In this process, the photoresist film (not shown) covers only the P well region 21, so that the N well region 22 is exposed for the process.

Thereafter, the semiconductor substrate 11 is subjected by annealing at the temperature in the range of 900 to 950° C. to form source regions 41 and 47 of PMOS and drain regions 40 and 45 of NMOS, which have predetermined junction depths.

In forming the spacers 43, the silicon oxide layer formed by a CVD method is etched by an anisotropic plasma etching process using a gas such as He, $C_2H_6$ and $CHF_3$.

In the step of forming the heavily doped N-type region 45, ion implantation is performed with As ions of $5.0 \times 10^{15}$ atoms/cm$^2$ using an acceleration energy of 100 KeV. At the same time, the first and third gates 37a and 37c are heavily doped by ion implantation. Similarly, the heavily doped P-type region 47 is formed by ion-implanting boron ions of $3.0 \times 10^{15}$ atoms/cm$^2$ using an acceleration energy of 50 KeV. Simultaneously, the second and fourth gates 37b and 37d are heavily doped by ion implantation.

AS shown in FIG. 1C, $CoSi_2$ layers 49a and 49b are formed on the source and drain regions 47 and 45 and on the upper surface of the first, second, third, and fourth gates 37a, 37b, 37c, and 37d by high temperature sputtering and in-situ vacuum annealing methods. Then, a thin silicon nitride ($Si_3N_4$) layer (not shown) and a thick borophosphosilicate glass (BPSG) layer 51 are deposited on the entire surface of the semiconductor substrate 11 by CVD. The BPSG layer is removed to have a predetermined thickness by chemical-mechanical polishing (CMP), so that the surface of the BPSG layer 51 is planarized. Using a photoresist film (not shown) as a mask, a predetermine portion where photoresist film is not covered is removed by plasma etching. Thus, this process removes a portion of the $CoSi_2$ layer 49a on the source and drain regions 47 and 45 and a portion of the spacers 43, and the isolation layer 13 of the third and fourth gates 37c and 37d. The photoresist film is then removed from the gates.

A thin titanium (Ti)/titanium nitride (TiN) film (not shown) and a thick tungsten (W) layer 53 are deposited on the entire surface of the semiconductor substrate 11 by a sputtering method. A portion of the multi-layers (W/TiN/Ti) deposited on the BPSG layer are removed completely by a CMP method. Thus, a portion of the layers (W/TiN/Ti) remain only in a predetermined groove-type portion. As a result, the layers 53 acts as a local interconnection (LI) between the gate and junction.

In the above-described process, the $CoSi_2$ layer is formed of a 150 Å thick salicide layer which is converted from a cobalt film deposited by a sputtering method in a salicide process. The silicon nitride layer $Si_3N_4$ is deposited to have a thickness in the range of 500 to 1000 Å by CVD. The BPSG layer is deposited to have a thickness of 8000 to 10000 Å using CVD. The Ti layer is formed to have a thickness in the range of 200 to 400 Å by sputtering. The W layer is deposited to have a thickness of 4000 to 5500 Å by sputtering.

However, the above-described related background art has a serious drawback. For example, the fabrication process becomes very complicated and takes much time. In forming a local interconnection between a gate and a junction, a main problem of the background art method is caused by the process steps of etching inter-level dielectric layers to expose the gate and the junction.

SUMMARY OF THE INVENTION

Accordingly, the present invention is directed to a method of fabricating a semiconductor device that substantially obviates one or more of problems due to limitations and disadvantages of the related art.

Another object of the present invention is to provide a method of fabricating a semiconductor device which has a local interconnection with a buried contact.

To achieve the object of the present invention, a method of fabricating a semiconductor device includes the steps of forming first and second wells in the substrate, the first and second wells having first and second type conductivities, respectively, forming first, second, and third isolation layers in the substrate, forming first and second gate oxide layers on the first and second wells, forming first and second buried contact regions in the substrate, and forming first and second impurity regions in the first and second buried contact regions, and forming first and second gates on the first well and third and fourth gates on the second well, the first and fourth gates directly contacting the first and second buried contact regions, respectively.

In another aspect of the present invention, a method of fabricating a semiconductor device includes the steps of forming first and second wells in the substrate, the first and second wells having first and second type conductivities, respectively, forming first, second, and third isolation layers, respectively, in the first well, the first and second well, and the third well, forming first and second gate oxide layers on the first and second wells, forming first and second buried contact regions in the substrate between the first, second, and third isolation layers, forming first and second impurity regions in the first and second buried contact regions, forming first and second gates on the first well and third and fourth gates on the second well, the first and fourth gates directly contacting the first and second buried contact regions, respectively, forming first and second pair of lightly doped drain regions at both sides of the second and third gates using the gates as masks, forming spacers on both sides of the first, second, third, and fourth gates, forming first and second pair of heavily doped regions at both sides of the second and third gates using the gates including the spacers as masks, and forming a planarization layer on the substrate including the gates.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings:

In the drawings:

FIGS. 1A to 1C are cross-sectional views illustrating the process steps of fabricating a semiconductor device according to a related background art; and FIGS. 2A to 2D are cross-sectional views illustrating the process steps of fabricating a semiconductor device according to the present invention.

DETAILED DESCRIPTION OF PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

FIGS. 2A to 2D are cross-sectional views illustrating the process steps of fabricating a semiconductor device according to the present invention.

Figure 1C:
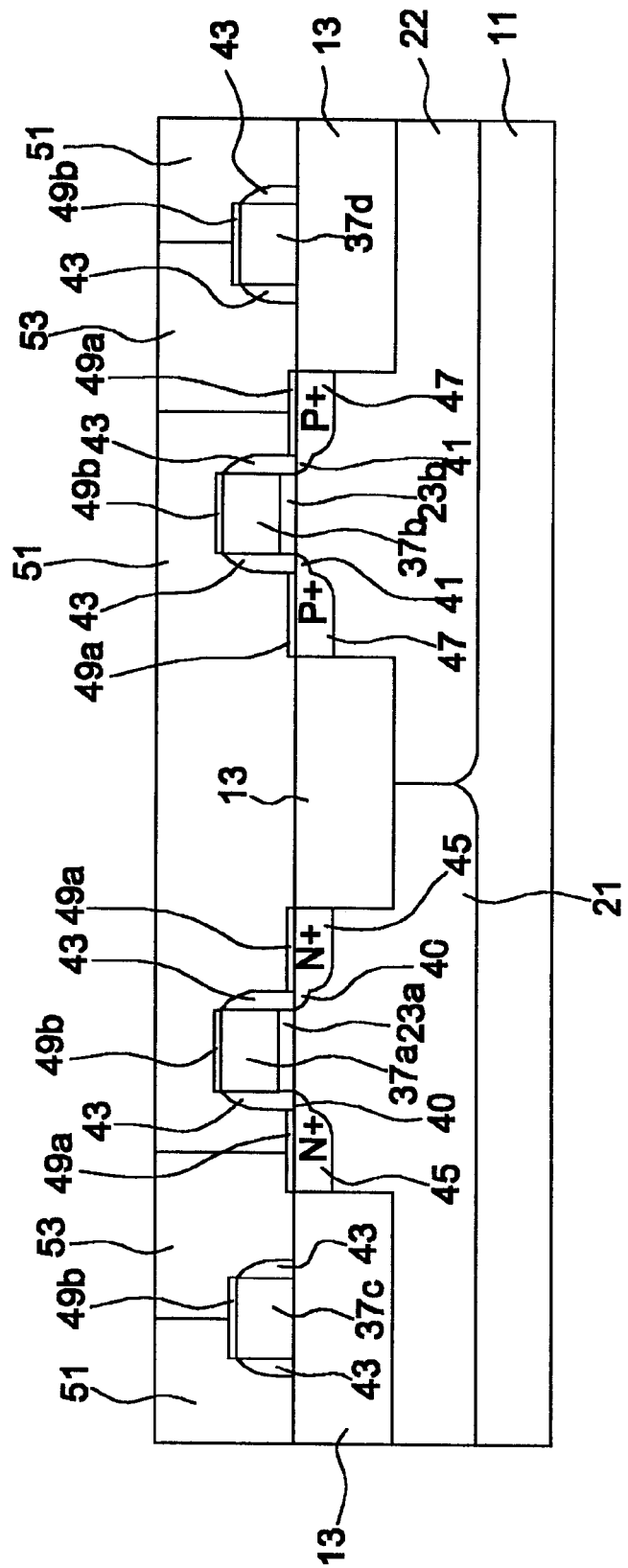
Figure 2A:
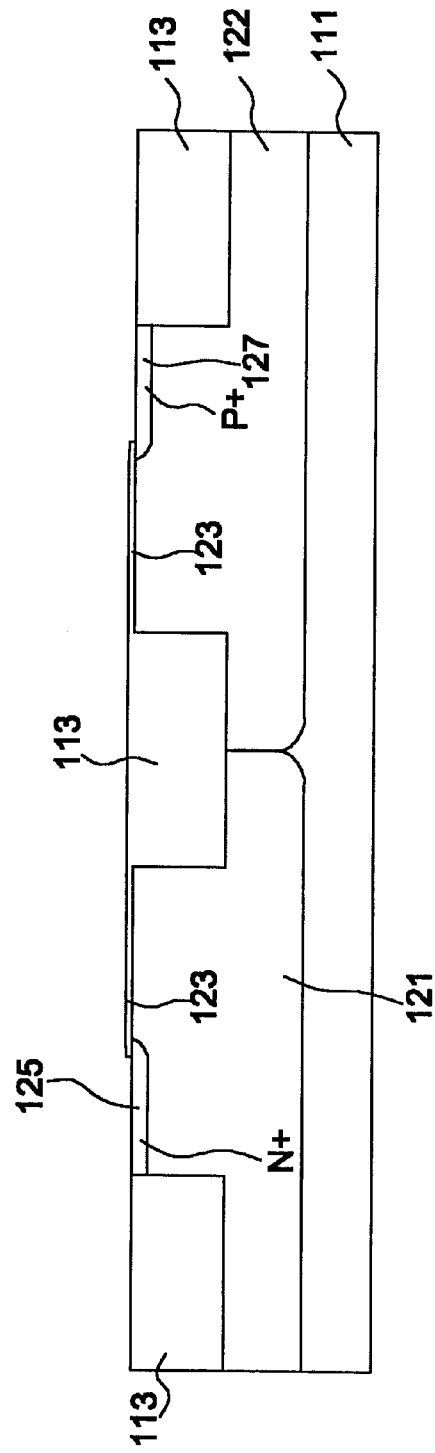

Initially referring to FIG. 2A, a P well 121 and an N well 122 which have a predetermined depth are formed in a semiconductor substrate 111. An isolation layer 113 is selectively formed to define the active region in the semiconductor substrate 111. A silicon oxide ($SiO_2$) layer is then formed on the semiconductor substrate 111 including the isolation layer 113. A photoresist layer (not shown) is formed on a portion of except for a first buried contact region on the N well region 122 by photolithography. In this process, the photoresist layer is used as a mask to expose the silicon oxide layer on the first buried contact region so that the exposed silicon oxide layer is removed from the semiconductor substrate 111 by wet or dry etching. Thus, a portion of the semiconductor substrate 111 is exposed for the first buried contact.

Subsequently, using the photoresist layer (not shown) as a mask, P-type ions are implanted into the first buried contact region of the semiconductor substrate 111, thereby forming a heavily doped P-type region 127. After removing the photoresist layer, another photoresist layer (not shown) is formed on the exposed surface of the semiconductor substrate 11 except for a second buried contact in the P well region 121 by photolithography. The photoresist layer is used as a mask to expose the second buried contact region by removing the silicon oxide ($SiO_2$) layer by wet or dry etching. Thus, a portion of the semiconductor substrate 111 for the second buried contact region is exposed. The photoresist layer (not shown) is then used as a mask in implanting N-type ions into the second buried contact region of the semiconductor substrate 111, thereby forming a heavily doped N-type region 125.

In the above-explained process, the isolation layer 113 is formed of silicon oxide having a thickness in the range of 3500 to 4500 Å and is formed by a shallow trench isolation (STI) method. The silicon oxide layer 123 is grown on the semiconductor substrate 111 by thermal oxidation. The silicon oxide layer 123 is used as a gate oxide layer of a PMOS and NMOS semiconductor device. The photoresist layers are removed using a solvent or oxygen plasma.

The heavily doped P-type region 127 is formed by implanting phosphorus (P) ions of $1.0 \times 10^{15}$ to $3.0 \times 10^{15}$ atoms/cm$^2$ using an acceleration energy of 30 KeV. Similarly, As ions in the range of $1.0 \times 10^{15}$ to $3.0 \times 10^{15}$ atoms/cm$^2$ using an acceleration energy of 30 KeV are implanted to form the heavily doped N-type region 125.

Figure 2B:
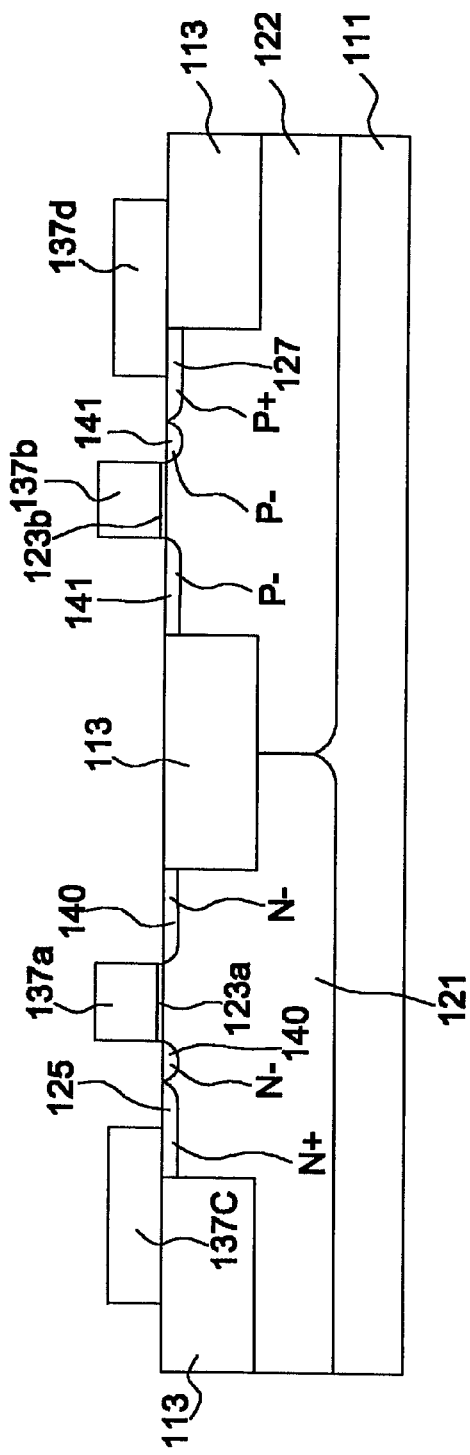

Referring to FIG. 2B, a polysilicon layer is formed on the entire surface of the semiconductor substrate including the silicon oxide layer and the isolation layer. Using another photoresist layer (not shown) formed at a gate region as a mask, a portion of the polysilicon layer is removed by plasma etching, thereby forming first, second, third, and fourth gates 137a, 137b, 137c and 137d. The photoresist layer used as a mask is then removed from the gates.

Thereafter, the N well region 122 is covered with another photoresist layer (not shown) while the P well region 121 is exposed. Using the first gate 137a as a mask, an N-type lightly doped drain (LDD) region 140 is formed by ion implantation into the P well region 121. This process is completed by a self-alignment method. The photoresist layer is then removed.

In the next step, the P well region 121 is covered with another photoresist layer (not shown) while the N well region 122 is exposed. Similarly, the second gate 137b is then used as a self-aligned mask for ion implantation to form a P-type lightly doped drain region 141 in the N well region 122.

In the above-mentioned process, the first, second, third, and fourth gates 137a, 137b, 137c, and 137d are formed of polysilicon layers and have a thickness in the range of 2500 to 4000 Å. The gates 137a, 137b, 137c, and 137d have a fine grain structure and are deposited by CVD. In addition, the first and second gates 137a and 137b protect the respective silicon oxide (SiO$_2$) layers 123a and 123b from causing a channeling effect during the subsequent ion implantation.

In the process of forming the N-type lightly doped drain region 140, phosphorus ions are implanted having a concentration of $1.0 \times 10^{13}$ to $1.0 \times 10^{14}$ atoms/cm$^2$ with an acceleration energy of 40 KeV. Simultaneously, the first and third gates 137a and 137c are lightly doped by ion implantation. Boron ions (using BF$_2$ as a boron source) are implanted with a concentration in the range of $1.0 \times 10^{13}$ to $1.0 \times 10^{14}$ atoms/cm$^2$ using an acceleration energy of 50 KeV in forming the P-type lightly doped drain region 141. At the same time, the second and fourth gates 137b and 137d are lightly doped by ion implantation.

The third gate 137c is formed on the isolation layer 113 and the N-type heavily doped drain region 125, which is the second buried contact region. Further, the third gate 137c is electrically connected to the N-type heavily doped drain region 125. Conversely, the fourth gate 137d is formed on the isolation layer 113 and the P-type heavily doped drain region 127, which is the first buried contact region. The fourth gate 137d is electrically connected to the P-type heavily doped drain region 127.

The N-type lightly doped drain region 140 is positioned between the first gate 137a and the N-type heavily doped drain region 125, which is the second buried contact region. On the other hand, the P-type lightly doped drain region 141 is positioned between the second gate 137b and the P-type heavily doped drain region 127, which is the first buried contact region.

In FIG. 2C, a silicon oxide (SiO$_2$) layer having a thickness of 600 to 1000 Å is deposited on the entire surface of the semiconductor substrate 111 by CVD. Then, the silicon oxide layer is etched by anisotropic plasma etching, thereby forming spacers 143 on both sides of each gate.

Subsequently, another photoresist layer (not shown) is formed to cover the N well region 122 and expose the P well region 121. With the first gate 137a as a mask, ion implantation is executed into the P well region 121 of the semiconductor substrate. Thus, an N-type heavily doped drain region 145 is formed in the P well region 121 using a self-alignment process. Thereafter, the photoresist layer is removed from the surface of the semiconductor substrate 111.

Successively, another photoresist layer (not shown) is formed to cover the P well region 121 and expose the N well region 122. The second gate 137b is then used as a mask in implanting P-type ions in the N well region of the semiconductor substrate 111. Therefore, a P-type heavily doped drain region 147 formed by a self-alignment process. Subsequently, the semiconductor substrate 111 is subjected by annealing at a temperature in the range of 900 to 1000° C. to form source regions 141 and 147 of PMOS and drain regions 140 and 145 of NMOS, which have predetermined junction depths.

A local interconnection (LI) between each gate and junction is formed by extending a length of the third gate 137c in such a manner that the third gate 137c doped with N-type impurities and formed on the isolation layer 113 is brought in contact with the heavily doped N-type region 125, which is the second buried contact region. Similarly, a local interconnection (LI) between a gate and junction is formed by extending the fourth gate 137d in such a manner that the fourth gate 137d doped with P-type impurities on the isolation layer 113 is brought in contact with the heavily doped P-type region 127, which is the second buried contact region.

The silicon oxide layer formed by a CVD method is etched by anisotropic plasma etching using a gas such as He, C$_2$H$_6$ and CHF$_3$, thereby forming the spacers 143. The N-type heavily doped drain region 145 is formed by implanting As ions of $1.0 \times 10^{15}$ to $5.0 \times 10^{15}$ atoms/cm$^2$, preferably, $5.0 \times 10^{15}$ atoms/cm$^2$ at an acceleration energy of 30 KeV. At the same time, the first and third gates 137a and 137c are heavily doped by ion implantation. Similarly, the P-type heavily doped drain region 147 is formed by performing a boron (BF$_2$) ion implantation with a concentration of $1.0 \times 10^{15}$ to $5.0 \times 10^{15}$ atoms/cm$^2$, preferably, $3.0 \times 10^{15}$ atoms/cm$^2$ at an acceleration energy of 30 KeV. Simultaneously, the second and fourth gates 137b and 137d are heavily doped by ion implantation.

As shown in FIG. 2D, the process of fabricating a semiconductor device is completed by forming a BPSG layer 151 having a thickness of 8000 to 10000 Å on the entire surface of the semiconductor substrate 111 by CVD.

As described above, since a local interconnection (LI) is formed between a gate and a junction by extending the gate to contact the junction through a buried contact region. As a result, the present invention provides a greatly simplified method as well as increases a yield in fabricating semiconductor devices.

It will be apparent to those skilled in the art that various modifications and variations can be made in the method of fabricating a semiconductor device of the present invention without departing from the spirit or scope of the invention. Thus, it is intended that the present invention cover the modifications and variations of this invention provided they come within the scope of the appended claims and their equivalents.

What is claimed is:

1. A method of fabricating a semiconductor device on a substrate, comprising the steps of:
    forming first and second wells in the substrate, the first and second wells having first and second type conductivities, respectively;
    forming first, second, and third isolation layers in the substrate;
    forming first and second gate oxide layers on the first and second wells;
    forming first and second buried contact regions in the substrate;
    forming first and second heavily doped regions in the first and second buried contact regions;
    forming first and third gates on the first well, and second and fourth gates on the second well, the third and fourth gates directly contacting the second and first buried contact regions, respectively;
    forming a first pair of lightly doped drain regions at both sides of the first gate using the first gate as a mask, wherein one of the lightly doped drain regions is positioned between the first gate and the second buried contact region; and
    forming a second pair of lightly doped drain regions at both sides of the second gate using the second gate as a mask, wherein one of the lightly doped drain regions is positioned between the second gate and the first buried contact region.

2. The method according to claim 1, further comprising the steps of:
    forming spacers on both sides of the gates;
    forming first and second pairs of heavily doped regions at both sides of the first and third gates using the gates including the spacers as masks; and
    forming a planarization layer on the substrate including the gates.

3. The method according to claim 1, wherein the first buried contact region has the first type conductivity and the second buried contact region has the second type conductivity.

4. The method according to claim 1, wherein the first buried contact region is formed between the second gate and the fourth gate, and the second buried contact region is formed between the first gate and the third gate.

5. The method according to claim 1, wherein the first gate is formed on the first gate oxide layer, and the second gate is formed on the second gate oxide layer.

6. The method according to claim 1, wherein the first, second and third isolation layers are formed in the first well, the first and second wells, and the second well, respectively.

7. The method according to claim 1, wherein the step of forming the first and second heavily doped regions includes ion implantation of second type conductivity ions and first type conductivity ions, respectively, with a dose of $1.0 \times 10^{15}$ to $3.0 \times 10^{15}$ atoms/Cm$^2$.

8. The method according to claim 2, wherein the step of forming first and second pairs of lightly doped drain regions includes the step of implanting second type conductivity ions and first type conductivity ions, respectively, with a dose of $1.0 \times 10^{13}$ to $1.0 \times 10^{14}$ atoms/cm$^2$.

9. The method according to claim 2, wherein the step of forming first and second pairs of heavily doped regions includes the step of:
    implanting second type conductivity ions and first type conductivity ions with a dose of $1.0 \times 10^{15}$ to $5.0 \times 10^{15}$ atoms/cm$^2$ at an acceleration energy of 30 KeV; and
    annealing at a temperature in the range of 900 to 1000 °C.

10. The method according to claim 1, wherein the first and second conductivities include an N-type and a P-type, respectively.

11. The method according to claim 2, wherein the step of forming spacers includes the step of:
    depositing a silicon oxide layer on the gates including the substrate; and
    selectively removing the silicon oxide layer from the substrate and the gates except from side portions of the gates.

12. The method according to claim 11, wherein the step of depositing a silicon oxide layer includes chemical vapor deposition.

13. The method according to claim 11, wherein the step of selectively removing the silicon oxide layer includes anisotropic etching.

14. The method according to claim 1, wherein the step of forming first, second, and third isolation layers includes a shallow trench isolation method.

15. A method of fabricating a semiconductor device on a substrate, comprising the steps of:
    forming first and second wells in the substrate, the first and second wells having first and second type conductivities, respectively;
    forming first, second, and third isolation layers, respectively, in the first well, the first and second well, and the third well;
    forming first and second gate oxide layers on the first and second wells;
    forming first and second buried contact regions in the substrate between the first, second, and third isolation layers;
    forming first and second heavily doped regions in the first and second buried contact regions;
    forming first and third gates on the first well, and second and fourth gates on the second well, the third and fourth gates directly contacting the second and first buried contact regions, respectively;
    forming lightly doped drain regions at both sides of the first gate using the gate as a mask, wherein one of the lightly doped drain regions is positioned between the first gate and the second buried contact region;
    forming lightly doped drain regions at both sides of the second gate using the gate as a mask, wherein one of the lightly doped drain regions is positioned between the second gate and the first buried contact region;
    forming spacers on both sides of the first, second, third, and fourth gates;
    forming first and second pairs of heavily doped regions at both sides of the first and second gates using the gates including the spacers as masks; and
    forming a planarization layer on the substrate including the gates.

16. The method according to claim 15, wherein the first buried contact region has the first type conductivity and the second buried contact region has the second type conductivity.

17. The method according to claim 15, wherein the step of forming the first and second heavily doped regions includes ion implantation of second type conductivity ions and first type conductivity ions with a dose of $1.0 \times 10^{15}$ to $3.0 \times 10^{15}$ atoms/cm$^2$.

18. The method according to claim 15, wherein the step of forming first and second pair of lightly doped drain regions includes the step of implanting second type conductivity ions and first type conductivity ions with a dose of $1.0 \times 10^{13}$ to $1.0 \times 10^{14}$ atoms/cm$^2$.

19. The method according to claim 15, wherein the step of forming first and second pairs of heavily doped regions includes the step of:

implanting second type conductivity ions and first type conductivity ions with a dose of $1.0 \times 10^{15}$ to $5.0 \times 10^{15}$ atoms/cm$^2$ at an acceleration energy of 30 KeV; and annealing at a temperature in the range of 900 to 1000° C.

20. The method according to claim 15, wherein the step of forming spacers includes the step of:

depositing a silicon oxide layer on the gates including the substrate; and selectively removing the silicon oxide layer from the substrate and the gates except from side portions of the gates.

\* \* \* \* \*